United States Patent [19]
Horiguchi et al.

[11] Patent Number: 5,176,309
[45] Date of Patent: Jan. 5, 1993

[54] METHOD OF MANUFACTURING CIRCUIT BOARD

[75] Inventors: Akihiro Horiguchi; Mitsuo Kasori, both of Kawasaki; Fumio Ueno; Hiroshi Komorita, both of Yokohama; Mitsuyoshi Endo, Tokyo, all of Japan

[73] Assignee: Kabushiki Kaisha Toshiba, Kawasaki, Japan

[21] Appl. No.: 704,094

[22] Filed: May 22, 1991

[30] Foreign Application Priority Data

May 25, 1990 [JP] Japan ................... 2-133957

[51] Int. Cl.⁵ .................... H05K 3/00; H05K 3/02
[52] U.S. Cl. .................... 228/122; 228/124; 228/203; 228/219; 228/263.12; 29/846
[58] Field of Search ............. 228/124, 195, 196, 203, 228/219, 263.12, 122; 29/846, 851

[56] References Cited

U.S. PATENT DOCUMENTS

| | | | |
|---|---|---|---|
| 3,744,120 | 7/1973 | Burgess et al. | 228/196 |
| 3,766,634 | 10/1973 | Babcock et al. | |
| 3,994,430 | 11/1976 | Cusano et al. | |
| 4,129,243 | 12/1978 | Cusano et al. | 228/122 |
| 4,505,418 | 3/1985 | Neidig et al. | 228/124 |
| 4,693,409 | 9/1987 | Mizunoya et al. | 228/263.18 |
| 4,849,292 | 7/1989 | Mizunoya et al. | 228/122 |

FOREIGN PATENT DOCUMENTS

| | | | |
|---|---|---|---|
| 59-3077 | 1/1984 | Japan . | |
| 59-121172 | 7/1984 | Japan | 228/263.12 |
| 59-121890 | 7/1984 | Japan | 228/263.12 |
| 60-4154 | 2/1985 | Japan . | |
| 60-32343 | 2/1985 | Japan . | |
| 761045 | 11/1956 | United Kingdom . | |

*Primary Examiner*—Samuel M. Heinrich
*Attorney, Agent, or Firm*—Oblon, Spivak, McClelland, Maier & Neustadt

[57] ABSTRACT

According to this invention, there is provided a method of manufacturing a highly reliable circuit board in which a copper member is strongly, directly bonded to a substrate made of an aluminum nitride sintered body, thereby obtaining high peel strength. The method of manufacturing the circuit board includes the steps of bringing a copper member containing 100 to 1,000 ppm of oxygen into contact with an oxide layer having a thickness of 0.1 to 5 μm formed on a surface of a substrate made of an aluminum nitride sintered body, and heating the substrate in an inert gas atmosphere containing 1 to 100 ppm of oxygen at a temperature not more than a temperature corresponding to a liquidus including a pure copper melting point of a hypoeutectic region of a two-component phase diagram of $Cu$-$Cu_2O$ and not less than a temperature corresponding to a eutectic line obtained by connecting a line corresponding to copper and a line corresponding to a cuporus oxide composition, and directly bonding the copper member to the substrate.

11 Claims, 3 Drawing Sheets

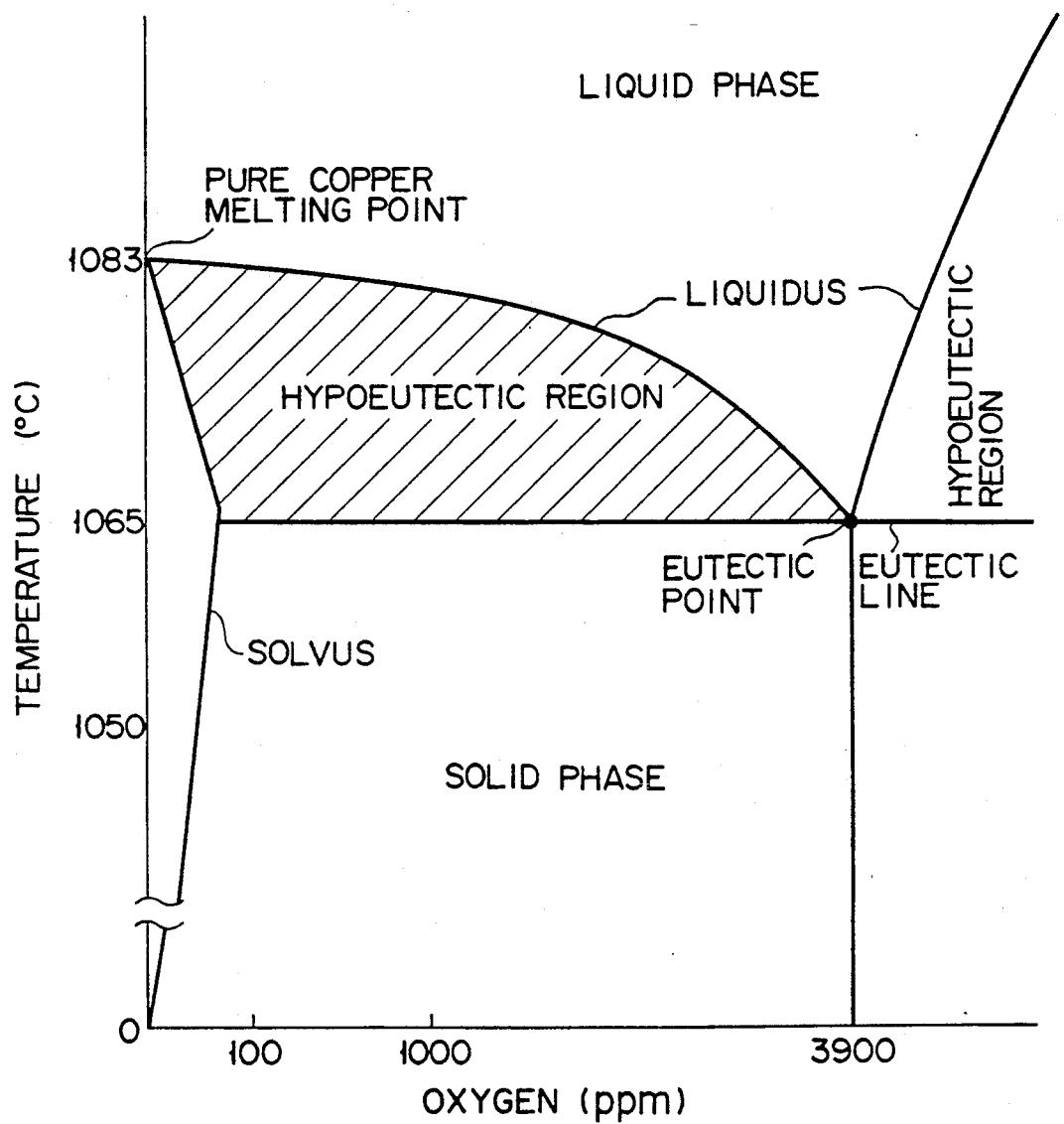
F I G. 1

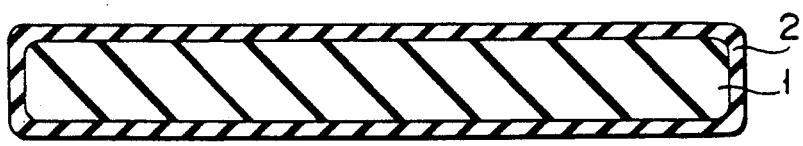
F I G. 2A
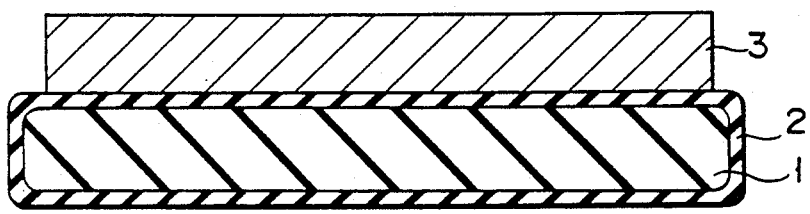
F I G. 2B
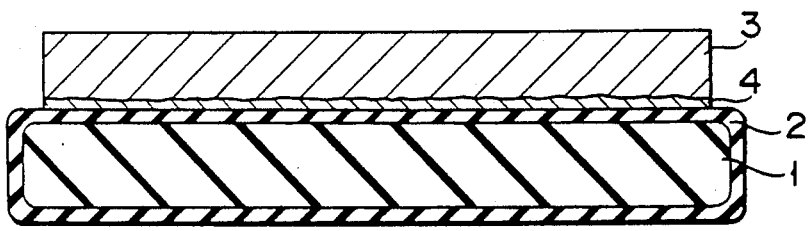
F I G. 2C
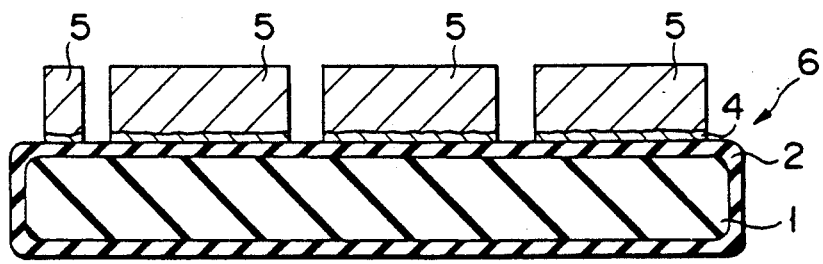
F I G. 2D

METHOD OF MANUFACTURING CIRCUIT BOARD

BACKGROUND OF THE INVENTION

1. Field of the Invention

The present invention relates to a method of manufacturing a circuit board in which a copper member is directly bonded to a substrate made of ceramics.

2. Description of the Related Art

In the Published Unexamined Japanese Patent Application No. 60-32343, a method of manufacturing a circuit board in which a copper member is bonded to a substrate made of ceramics such as an aluminum nitride (AlN) sintered body is disclosed. In this method, a paste or foil of Ti or Zr serving as an active metal is interposed between the substrate and the copper member, and the substrate and the copper member are heated in a vacuum atmosphere to be bonded to each other. In this method, however, the paste must be coated, or the foil must be cut into pieces having sizes of the substrate and the copper member. In addition, since the substrate and the copper member must be heated in a vacuum atmosphere to be bonded to each other, a batch-type heating furnace must be used. For this reason, the process becomes cumbersome to degrade mass productivity.

In the Published Unexamined Japanese Patent Application No. 59-3077, a method of manufacturing a circuit board in which a copper member is directly bonded to a substrate made of an AlN sintered body is disclosed. In this method, the substrate is oxidized on its surface, and a copper member containing 100 to 2,000 ppm of oxygen is brought into contact with the oxide layer formed on the substrate. Thereafter, the resultant structure is heated in an inert gas atmosphere such as nitrogen gas or Ar gas, and the copper member is directly bonded to the substrate, thereby manufacturing a circuit board. In this method, since the heating is performed in the inert gas atmosphere, although the copper member contains oxygen, a hypoeutectic alloy liquid phase is partially decomposed on the bonding interface, and oxygen is compositionally decreased. The equilibrium oxygen partial pressure of a reaction $2Cu_2O*4Cu+O_2$ at a temperature of $1,065°$ C. is $1.5 \times 10^{-6}$ atm., and the reaction is expected to be performed in the hypoeutectic alloy liquid phase. Namely, the hypoeutectic alloy liquid phase i partially decomposed due to heating in the inert gas. In addition, since the heating temperature for bonding the copper member and the substrate is higher than a temperature corresponding to a eutectic line in a hypoeutectic region, an equilibrium oxygen partial pressure at this temperature is further increased. As a result, a eutectic alloy liquid phase produced in the copper member by reduction which the reaction moves forward right, is decreased. Therefore, only a very small amount of eutectic alloy liquid phase is produced on the bonding interface, and the eutectic alloy liquid phase cannot be used for bonding the copper member and the substrate. As a result, a portion where the copper member is not microscopically bonded to the substrate is made, or the bonding strength of a circuit board is disadvantageously decreased.

In the Published Unexamined Japanese Patent Application No. 59-3077, a method in which a member made of copper containing no oxygen (oxygen-free copper) is used is disclosed. In this method, a substrate made of an AlN sintered body and the oxygen-free copper member are heated in a reactive gas atmosphere containing 0.03 to 0.1 vol% of oxygen to be bonded to each other. However, even in this method, the following problem is posed. That is, since the oxygen content is as large as 0.03 to 0.1 vol% in the heating atmosphere, oxidation is difficult to properly control, and the surface of the copper member is excessively oxidized. As a result, the oxide layer must be removed from the surface of the copper member by etching or the like after the bonding step, or the oxide layer must be removed by reduction in a hydrogen atmosphere. When these steps are employed, the number of steps is increased to degrade mass productivity, and the surface of the copper member is roughened.

In the specification of the British Patent Publication No. 761045, a method of manufacturing a circuit board in which a copper member is bonded to a substrate made of an aluminum oxide (alumina) sintered body is described. In this method, the copper member is oxidized in advance, an oxide layer formed on the copper member is located on the substrate of the alumina sintered body, and the resultant structure is heated at a temperature which is higher than the melting point of copper ($1,083°$ C.) and lower than the melting point of cuporus oxide (about $1,200°$ C.). This specification describes that copper is melted, but cuprous oxide is not melted upon the heating operation. Therefore, the substrate and the copper member are bonded to each other in the region having an amount of oxygen larger than that of a eutectic point (a point of 3,900 ppm of oxygen) in the $Cu-Cu_2O$ phase diagram. Since the copper member is inevitably oxidized, when the copper member is applied to a circuit board, the oxide layer must be removed from the copper member, thereby roughening the surface of the copper member.

In the specification of the U.S. Pat. Publication No. 3,744,120, the following method is disclosed. That is, in this method, a copper member is arranged to a substrate made of an alumina sintered body, and the copper member and the substrate are heated in a reactive gas atmosphere containing 0.01 to 0.5 vol% of oxygen to be bonded to each other. In this method, however, since the heating operation is performed in the reactive gas atmosphere containing 0.01 to 0.5 vol% of oxygen, an oxide layer is formed on the surface of the copper member. Therefore, a cumbersome step is required to remove the oxide layer, and the surface of the copper member is roughened.

In the Published Examined Japanese Patent Application No. 60-4154, another method of bonding a copper member to a substrate made of an aluminum sintered body is disclosed. In this method, after the surface of the copper member is oxidized, an oxide layer of the copper member is arranged on the substrate, and the copper member and the substrate are heated in an inert gas to be bonded to each other. In this method, as in the method of the above-described Published Unexamined Japanese Patent Application No. 59-3077, a eutectic alloy liquid phase serving as a sintering agent is decomposed at the bonding temperature (about $1,070°$ C.), and the eutectic alloy liquid phase is decreased by reduction. As a result, the eutectic alloy liquid phase is not supplied to the entire surface of the substrate made of the alumina sintered body at the bonding temperature, and a portion where the copper member and the substrate are not microscopically bonded is made. In the Published Examined Japanese Patent Application No. 60-4154, the following method is described as a method of supplying a binder in addition to the method of oxidizing the copper surface. That is, particle-like compound made of a binder and copper may be applied to the bonding surface of the copper member. However, even when the particle-like compound is interposed between the substrate and the copper member, since the substrate and the copper member are bonded to each other in an inert gas at an equilibrium oxygen partial pressure, reduction naturally occurs. In addition, since use of the binder is required, the step of bonding the copper member and the substrate is cumbersome.

SUMMARY OF THE INVENTION

It is an object of the present invention to provide a method of manufacturing a circuit board in which a copper member is bonded to a ceramic substrate at a peel strength of 5 kgf/cm or more. The term "peel strength" means the minimum force which must be applied at right angle away from the substrate, to peel the copper member from the substrate.

It is another object of the present invention to provide a method of manufacturing a circuit board in which a copper member is bonded to a ceramic substrate while the surface of a copper member is rarely oxidized, and the terminals of electronic parts such as a semiconductor element, a resistor element, and a capacitor are satisfactorily connected to and mounted on the copper member.

According to the present invention, there is provided a method of manufacturing a circuit board comprising the steps of bringing a copper member containing 100 to 1,000 ppm of oxygen into contact with an oxide layer having a thickness of 0.1 to 5 $\mu$m formed on a surface of a substrate made of an aluminum nitride (AlN) sintered body; and heating the substrate in an inert gas atmosphere containing 1 to 100 ppm of oxygen at a temperature not more than a temperature corresponding to a liquidus including a pure copper melting point of a hypoeutectic region of a two-component phase diagram of $Cu-Cu_2O$ and not less than a temperature corresponding to a eutectic line obtained by connecting a line corresponding to copper and a line corresponding to a cuporus oxide composition, and directly bonding the copper member to the substrate.

The AlN sintered body is manufactured by one of the following three alternative methods. The first method is to add a sintering aid to AlN powder, to mold the resultant mixture powder, and to sinter the resultant molding under atmospheric pressure. The second method is to add a sintering aid to AlN powder, to prepare slurry containing the resultant mixture powder, to form green sheets from the slurry by doctor-blade method, and to sinter the green sheets under atmospheric pressure. The third method is to hot-press AlN powder. As the sintering aid, at least one selected from an alkaline-earth compound powder and a rare-earth compound powder can be used. As the alkaline-earth compound powder, e.g., oxides, carbides, fluorides, carbonates, oxalates, nitrates, alkoxides, or the like of Ca, Ba, and Sr can be used. As the rare-earth compound, e.g., oxides, carbides, fluorides, carbonates, oxalates, nitrates, alkoxides, or the like of Y, La, Ce, Nd, Dy, and Pr can be used, and more particularly, a compound made of Y, La, and Ce is preferably used.

As the oxide layer formed on the surface of the AlN sintered body, an $\alpha-Al_2O_3$ layer or an aluminum oxynitride layer can be used. The oxide layer is formed by thermal oxidation, sol-gel method, or alcoxy method. The thickness of the oxide layer is limited due to the following reason. When the thickness of the oxide layer is less than 0.1 $\mu$m, a uniform oxide layer is not formed on the entire surface of the AlN sintered body to partially expose the AlN sintered body, and the copper member is partially brought into direct contact with the substrate of the AlN sintered body. Therefore, the eutectic alloy liquid phase is reduced by the AlN sintered body upon the heating operation, and a desired bonding strength cannot be obtained. In addition, when the thickness of the oxide layer is more than 5 $\mu$m, a difference in thermal expansion coefficient between the AlN sintered body and the oxide layer having a thermal expansion coefficient larger than that of the AlN sintered body is increased, and a desired bonding strength cannot be obtained.

The copper member has a plate-like shape or a shape similar to a circuit pattern.

The copper member contains oxygen which is very important for bonding the copper member to the substrate. When oxygen is supplied from an atmosphere upon the bonding of the substrate and the copper member, the surface of the copper member is radically oxidized, thereby roughening the surface. Therefore, according to the present invention, oxygen is not supplied from the atmosphere to the bonding interface between the substrate and the copper member, and the oxygen in the copper member contributes to the bonding of the copper member and the substrate. It is important that oxygen be contained in the copper member in an amount great enough to produce a eutectic alloy liquid phase in the bonding region between the copper member and the oxide layer formed on the surface of the substrate. The amount of oxygen is 100 ppm or more. That is, when the amount of oxygen contained in the copper member is less than 100 ppm, since a sufficient amount of eutectic alloy liquid phase is not produced on the bonding interface between the copper member and the substrate, the substrate and the copper member are microscopically, partially bonded to each other. Therefore, a circuit board having a sufficient peel strength cannot be obtained. On the other hand, when the amount of oxygen contained in the copper member is more than 1,000 ppm, the surface of the copper member is roughened by a heating step in the bonding operation, thereby degrading the reliability of the circuit board. The amount of oxygen contained in the operation, thereby degrading the reliability of the circuit board. The amount of oxygen contained in the copper member is preferably in a range of 150 to 600 ppm.

The heating step is performed at a temperature not more than a temperature corresponding to a liquidus including a pure copper melting point of a hypoeutectic region of a two-component phase diagram of $Cu-Cu_2O$ shown in FIG. 1 and not less than a temperature corresponding to a eutectic line obtained by connecting a line corresponding to copper and a line corresponding to a cuporus oxide composition, i.e., in a temperature region indicated by oblique lines in FIG. 1. The heating temperature is limited due to the following reason. When the heating temperature is less than a temperature corresponding to the eutectic line, an eutectic alloy liquid phase cannot be produced on the bonding interface between the substrate and the copper member. When the heating temperature is more than a temperature corresponding to the liquidus in the region including the pure copper melting point, the copper member is entirely melted.

The heating step is performed in an inert gas (nitrogen, argon, helium, or the like) atmosphere containing 1 to 100 ppm of oxygen. The reason for limiting the amount of oxygen will be described below.

The equilibrium oxygen partial pressure of $Cu_2O$ at a temperature of 1,065° C. is $1.5 \times 10^{-6}$ atm. When the amount of oxygen in the atmosphere of the furnace is less than this value, $Cu_2O$ is decomposed. The eutectic alloy liquid phase is decreased by the same reaction as described above, a liquid phase associated with the bonding is decreased, and the substrate made of the AlN sintered body is not satisfactorily bonded to the copper member. Therefore, the amount of oxygen in the atmosphere must be 1 ppm or more. In addition, when the amount of oxygen is slightly less than the equilibrium oxygen partial pressure, the eutectic alloy liquid phase is rarely reduced. In this case, an amount of oxygen in the range (100 to 1,000 ppm) is contained in the copper member in advance. The amount of oxygen enables the copper member to be bonded firmly to the substrate. When the substrate and the copper member are thermally bonded to each other in an atmosphere containing less than 1 ppm of oxygen, even when the amount of oxygen contained in the copper member is 1,000 ppm which is a maximum value, the bonding strength (peel strength; less than 5 kgf/cm) between the substrate and the copper member is an allowable value or less in practical use. When an amount of oxygen in the atmosphere is excessively larger than the equilibrium oxygen partial pressure upon the heating operation at a temperature falling within the above-described range, the copper member is excessively oxidized and cannot be directly used as a circuit board. Therefore, the maximum amount of oxygen in the atmosphere must be 100 ppm. In addition, when the bonding is performed in the atmosphere containing this amount of oxygen, the reaction is performed for a short time, e.g., several seconds to several minutes. In this case, since the amount of oxygen is slightly larger than the equilibrium oxygen partial pressure, no conspicuous oxidation is performed, and the copper member can be used in practice. The amount of oxygen in the atmosphere is preferably in a range of 1 to 50 ppm.

According to the present invention, after the copper member is bonded to the substrate made of the AlN sintered body, the copper member may be processed by etching or the like to form a circuit pattern.

According to the present invention, only the copper member may be processed to form a circuit pattern, thereby manufacturing a circuit board, or the circuit board may be manufactured using a thick film formation technique and a thin film formation technique.

According to the present invention, a copper member containing 100 to 1,000 ppm of oxygen is brought into contact with an oxide layer having a thickness of 0.1 to 5 $\mu$m formed on a surface of a substrate made of an AlN sintered body, and the resultant structure is heated in an inert gas atmosphere at a temperature not more than a temperature corresponding to a liquidus including a pure copper melting point of a hypoeutectic region of a two-component phase diagram of $Cu-Cu_2O$ shown in FIG. 1 and not less than a temperature corresponding to a eutectic line obtained by connecting a line corresponding to copper and a line corresponding to a cuporus oxide composition. The inert gas atmosphere contains 1 to 100 ppm of oxygen. In the heating step, oxygen is rarely supplied from the atmosphere to the bonding interface between the substrate and the copper member, and the oxygen in the copper member contributes to the bonding of the copper member and the substrate. As a result, the surface of the copper member is rarely oxidized, and a sufficient amount of eutectic alloy liquid phase is produced on the bonding interface between the copper member and the oxide layer on the surface of the substrate made of AlN sintered body. A highly reliable circuit board having a high peel strength in which the copper member is directly bonded to the substrate can be manufactured. That is, the copper member is strongly bonded to the substrate with a peel strength of 5 kgf/cm or more. Although an oxide is present in the grain boundary of the copper member after the bonding, an oxide film is not substantially produced on the surface of the copper member, and copper is exposed. As a result, even when an etching process for removing the oxide film is not performed on the surface of the copper member after the bonding step, the terminals of electric parts such as a semiconductor element, a resistor element, and a capacitor can be satisfactorily connected and mounted to and on the copper member.

According to the present invention, there is provided a method of manufacturing a circuit board, comprising the steps of bringing a copper member containing 100 to 1,000 ppm of oxygen into contact with a substrate made of an aluminum oxide sintered body; and heating the substrate in an inert gas atmosphere containing 1 to 100 ppm of oxygen at a temperature not more than a temperature corresponding to a liquidus including a pure copper melting point of a hypoeutectic region of a two-component phase diagram of $Cu-Cu_2O$ and not less than a temperature corresponding to a eutectic line obtained by connecting a line corresponding to copper and a line corresponding to a cuprous oxide composition, and directly bonding the copper member to the substrate.

The copper member contains oxygen which is very important for bonding the copper member to an aluminum oxide (alumina) sintered body serving as the substrate. When oxygen is supplied from an atmosphere upon bonding of the substrate and the copper member, the surface of the copper member is radically oxidized, thereby roughening the surface. Therefore, according to the present invention, oxygen is not supplied from the atmosphere to the bonding interface between the substrate and the copper member, and only the oxygen in the copper member contributes to the bonding of the copper member and the substrate. It is important that oxygen be contained in the copper member in an amount great enough to produce a eutectic alloy liquid phase in the bonding region between the copper member and the substrate made of the alumina sintered body. The amount of oxygen is 100 ppm or more. That is, when the amount of oxygen included in the copper member is less than 100 ppm, since a sufficient amount of eutectic alloy liquid phase is not produced from the copper member to the bonding interface between the copper member and the substrate, the substrate and the copper member are microscopically, partially bonded to each other. Therefore, a circuit board having a sufficient peel strength cannot be obtained. On the other hand, when the amount of oxygen contained in the copper member is more than 1,000 ppm, the surface of the copper member is roughened by a heating step in the bonding operation, thereby degrading the reliability of the circuit board. The amount of oxygen contained in the copper member is preferably in a range of 100 to 600 ppm.

The heating step is performed at a temperature not more than a temperature corresponding to a liquidus including a pure copper melting point of a hypoeutectic region of a two-component phase diagram of Cu-Cu$_2$O shown in FIG. 1 and not less than a temperature corresponding to a eutectic line obtained by connecting a line corresponding to copper and a line corresponding to a cuporus oxide composition, i.e., in a temperature region indicated by oblique lines in FIG. 1. The heating temperature i limited due to the following reason. When the heating temperature is less than a temperature corresponding to the eutectic line, an eutectic alloy liquid phase cannot be produced on the bonding interface between the substrate and the copper member. When the heating temperature is more than a temperature corresponding to the liquidus in the region including the pure copper melting point, the copper member is entirely melted.

The heating step is performed in an inert gas (nitrogen, argon, helium, or the like) atmosphere containing 1 to 100 ppm of oxygen. The reason for limiting the amount of oxygen will be described below.

The equilibrium oxygen partial pressure of Cu$_2$O at a temperature of 1,065° C. is $1.5 \times 10^{-6}$ atm. When the amount of oxygen in the atmosphere of the furnace is less than this value, Cu$_2$O is decomposed. The eutectic alloy liquid phase is decreased by the same reaction as described above, liquid phase for the bonding is decreased, and the substrate made of the alumina sintered body is not satisfactorily bonded to the copper member. Therefore, the amount of oxygen in the atmosphere must be 1 ppm or more. In addition, when the amount of oxygen is slightly less than the equilibrium oxygen partial pressure, the eutectic alloy liquid phase is rarely reduced. In this case, an amount of oxygen in the range (100 to 1,000 ppm) is contained in the copper member in advance. The amount of oxygen enables the copper member to be bonded firmly to the substrate. When the substrate and the copper member are thermally bonded to each other in an atmosphere containing less than 1 ppm of oxygen, even when the amount of oxygen contained in the copper member is 1,000 ppm which is a maximum value, the bonding strength (peel strength: less than 5 kgf/cm) between the substrate and the copper member is an allowable value or less in practical use. When an amount of oxygen in the atmosphere is excessively larger than the equilibrium oxygen partial pressure upon the heating operation at a temperature falling within the above-described range, the copper member is excessively oxidized and cannot be directly used as a circuit board. Therefore, the maximum amount of oxygen in the atmosphere must be 100 ppm. In addition, when the bonding is performed in the atmosphere containing this amount of oxygen, the reaction is performed for a short time, e.g., several seconds to several minutes. In this case, since the amount of oxygen is slightly larger than the equilibrium oxygen partial pressure, no conspicuous oxidation is performed, and the copper member can be used in practice. The amount of oxygen in the atmosphere is preferably in a range of 1 to 50 ppm.

According to the present invention, after a copper member containing a predetermined amount of oxygen is brought into contact with a substrate made of an alumina sintered body, the substrate is heated in an inert gas atmosphere at a temperature not more than a temperature corresponding to liquidus including a pure copper melting point of a hypoeutectic region of a two-component phase diagram of Cu-Cu$_2$O shown in FIG. 1 and not less than a temperature corresponding to a eutectic line obtained by connecting a line corresponding to copper and a line corresponding to a cuporus oxide composition. The inert gas atmosphere contains a predetermined amount of oxygen. Therefore, an oxide film produced by excessively oxidizing the surface of the copper member is not produced, and a highly reliable circuit board having a high peel strength in which the copper member is satisfactorily, directly connected to the substrate can be manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description given above and the detailed description of the preferred embodiments given below, serves to explain the principles of the invention.

FIG. 1 is a two-component phase diagram of Cu-Cu$_2$O;

FIGS. 2A to 2D are sectional views showing manufacturing steps of a circuit board according to Example 1 of the present invention.

DETAILED DESCRIPTION OF THE PREFERRED EMBODIMENTS

Figure 3:
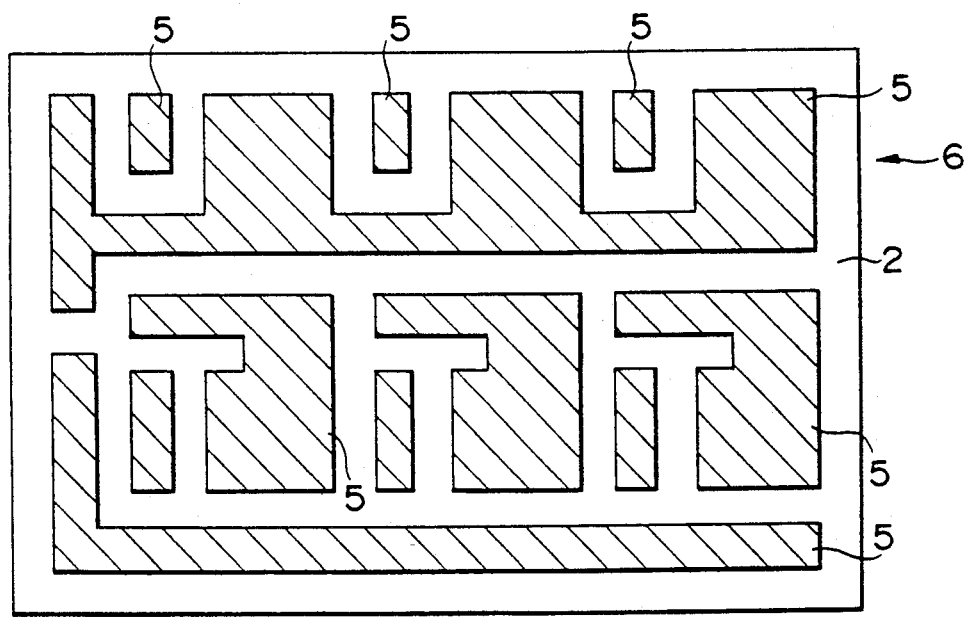
FIG. 3 is a plane view showing a circuit board in FIG. 2D.

Preferred examples of the present invention will be described below.

EXAMPLE 1

FIGS. 2A to 2D are sectional views showing manufacturing steps of a circuit board of Example 1 using an AlN sintered body as a substrate.

An AlN powder containing 3 wt% of yttrium oxide as a sintering aid was molded, and it was sintered under atmospheric pressure to form an AlN sintered body. Alternatively, the AlN sintered body is manufactured by the following method. The method is to add 3 wt% of yttrium oxide to AlN powder, to prepare slurry containing the resultant mixture powder, to form green sheets from the slurry by doctor-blade method, and to sinter the green sheets under atmospheric pressure. Thereafter, the AlN sintered body was formed into a substrate 1 consisting of a plate-like AlN sintered body having a size of 35 mm × 55 mm × 0.7 mm. As shown in FIG. 2A, the substrate 1 was heated at a temperature of 1,130° C. for 3 hours to form an $\alpha$-Al$_2$O$_3$ layer 2 having a thickness of about 1 μm on both surfaces and all sides of the substrate 1. Alternatively, the $\alpha$-Al$_2$O$_3$ layer 2 can be formed on only that surface of the substrate on which the copper member will be formed.

As shown in FIG. 2B, a plate-like copper member 3 having a size of 20 mm×50 mm×0.3 mm and containing an oxygen of 400 ppm was mounted on the α-Al$_2$O$_3$ layer 2 on the upper surface of the substrate 1. The substrate on which the copper member was mounted was set in a heating furnace (not shown), and a nitrogen gas atmosphere containing 7 ppm of oxygen was set in the heating furnace. The substrate was heated at a maximum temperature of 1,070° C. for three minutes and cooled to room temperature. On the interface between the copper member 3 and the α-Al$_2$O$_3$ layer 2 formed on the surface of the substrate 1 made of the AlN sintered body extracted from the heating furnace, as shown in FIG. 2C, a eutectic alloy layer 4 made of Cu and Cu$_2$O was formed. At this time, oxide was present in a small amount, at the grain boundary of the copper member 3 but no oxide films were found on the surface of the copper member 3. In addition, when a peel strength test was performed to test the bonding strength of the copper member 3, it was confirmed that the copper member 3 had a high strength of 11 kgf/cm.

The copper member 3 and the eutectic alloy layer 4 on the substrate 1 were patterned by a photoetching method to manufacture a circuit board 6 having a copper circuit pattern 5, as shown in FIGS. 2D and 3. Note that FIG. 3 is a plane view of FIG. 2D.

It was confirmed that the obtained circuit pattern 5 on the circuit board 6 had the same high peel strength (11 kgf/cm) as in the bonding state of the copper member 3. The terminals of electric parts such as semiconductor elements could be satisfactorily connected to the circuit pattern 5 of the circuit board 6, thereby highly reliably mounting the parts on the circuit pattern 5.

COMPARATIVE EXAMPLE 1

As in Example 1, a substrate made of an AlN sintered body was prepared. A plate-like copper member containing 400 ppm of oxygen was directly mounted on the substrate without heating the substrate in the air. The substrate on which the copper member was directly mounted was set in a heating furnace, and a nitrogen gas atmosphere containing 7 ppm of oxygen was set in the heating furnace. The substrate was heated at a maximum temperature of 1,070° C. for three minutes and cooled to room temperature. Only a part of the copper member was bonded to the substrate made of the AlN sintered body removed from the heating furnace. When a peel strength test was performed to test the bonding strength of the copper member, it was confirmed that the strength of the copper member was 1 kgf/cm which was smaller than that of Example 1.

COMPARATIVE EXAMPLE 2

As in Example 1, a substrate made of an AlN sintered body was heated at a temperature of 1,130° C. in an air for three hours, thereby an Al$_2$O$_3$ layer was formed on a surface of the substrate. A plate-like copper member containing 400 ppm of oxygen was mounted on the Al$_2$O$_3$ layer formed on the upper surface of the substrate. The substrate on which the copper member was mounted was set in a heating furnace, and a nitride gas atmosphere containing 0.1 ppm of oxygen was set in the heating furnace. The substrate was heated at a maximum temperature of 1,070° C. for three minutes and cooled to room temperature. A peel strength test was performed to test the bonding strength of the copper member on the substrate made of the AlN sintered body and extracted from the heating furnace. As a result, it was confirmed that the strength of the copper member was 4 kgf/cm which was smaller than that of Example 1.

COMPARATIVE EXAMPLE 3

As in Example 1, a substrate made of an AlN sintered body was heated at a temperature of 1,130° C. in an air for three hours, thereby an Al$_2$O$_3$ layer was formed on a surface of the substrate. A plate-like oxygen-free copper member was mounted on the Al$_2$O$_3$ layer formed on the upper surface of the substrate. The substrate on which the copper member was mounted was set in a heating furnace, and a nitride gas atmosphere containing 300 ppm of oxygen was set in the heating furnace. The substrate was heated at a maximum temperature of 1,070° C. for thirty seconds and cooled to room temperature. A peel strength test was performed to test the bonding strength of the copper member on the substrate made of the AlN sintered body and extracted from the heating furnace. As a result, the copper member had a relatively high strength of 8 kgf/cm. However, the surface of the copper member was excessively oxidized in the bonding step to change its color into reddish purple.

EXAMPLE 2

An alumina powder containing 3 wt% of magnesium oxide as a sintering aid was sintered under an atmospheric pressure to form an alumina sintered body. Thereafter, the sintered body was formed into a substrate 1 consisting of a plate-like alumina sintered body having a size of 35 mm×55 mm×0.7 mm. A platelike copper member having a size of 10 mm×50 mm×0.3 mm and containing 400 ppm of oxygen is mounted on the upper surface of the substrate. The substrate on which the copper member was mounted was set in a heating furnace, and a nitrogen gas atmosphere containing 7 ppm of oxygen was set in the heating furnace. The substrate was heated at a maximum temperature of 1,070° C. for three minutes and cooled to room temperature. On the interface between the substrate made of the alumina sintered body extracted from the heating furnace and the copper member, a eutectic alloy layer made of Cu and Cu$_2$O was formed. At this time, oxide was present in a small amount, at the grain boundary of the copper member, but no oxide films were found on the surface of the copper member. In addition, when a peel strength test was performed to test the bonding strength of the copper member, it was confirmed that the copper member 3 had a high strength of 11 kgf/cm.

The copper member on the substrate was patterned by a photoetching method to manufacture a circuit board having a copper circuit pattern. It was confirmed that the obtained circuit pattern on the circuit board had the same high peel strength (11 kgf/cm) a in the bonding state of the copper member. The terminals of electric parts such as semiconductor elements could be satisfactorily connected to the circuit pattern of the circuit board, thereby highly reliably mounting the parts on the circuit pattern.

COMPARATIVE EXAMPLE 4

A plate-like copper member containing 400 ppm of oxygen was mounted on a substrate made of the same alumina sintered body as in Example 2. The substrate on which the copper member was mounted was set in a heating furnace and a nitride gas atmosphere containing 0.1 ppm of oxygen was set in the heating furnace. The substrate was heated at a maximum temperature of 1,070° C. for three minutes and cooled to room temperature. A peel strength test was performed to test the bonding strength of the copper member on the substrate made of the alumina sintered body removed from the heat furnace. As a result, is was confirmed that the strength of the copper member was 4 kgf/cm which was smaller than that of Example 2.

COMPARATIVE EXAMPLE 5

A plate-like oxygen-free copper member was mounted on a substrate made of the same alumina sintered body as in Example 2. The substrate on which the copper member was mounted was set in a heating furnace, and a nitride gas atmosphere containing 300 ppm of oxygen was set in the heating furnace. The substrate was heated at a maximum temperature of 1,070° C. for thirty seconds and cooled to room temperature. A peel strength test was performed to test the bonding strength of the copper member on the substrate made of the alumina sintered body and extracted from the heating furnace. As a result, the copper member had relatively high strength of 8 kgf/cm. However, the surface of the copper member was excessively oxidized in the bonding process to change its color into reddish purple.

As described above, according to the present invention, there is provided a method of simply manufacturing highly reliable circuit boards with mass production. That is, in the circuit board, a copper member is strongly bonded to a substrate made of an AlN sintered body or an aluminum oxide sintered body while the surface of the copper member is rarely oxidized, and the terminals of electronic parts such as a semiconductor element, a resistor element, or a capacitor can be satisfactorily connected to and mounted on the copper member.

Additional advantages and modifications will readily occur to those skilled in the art. Therefore, the invention in its broader aspects is not limited to the specific details and illustrated examples shown and described herein. Accordingly, various modifications may be made without departing from the spirit or scope of the general inventive concept as defined by the appended claims and their equivalents.

What is claimed is:

1. A method of manufacturing a circuit board comprising the steps of:
   a copper member containing 100 to 1,000 ppm of oxygen into contact with an oxide layer having a thickness of 0.1 to 5 μm formed on a surface of a substrate made of an aluminum nitride sintered body; and
   heating said substrate in an inert gas atmosphere containing 1 to 100 ppm of oxygen at a temperature not more than a temperature corresponding to a liquidus including a pure copper melting point of a hypoeutectic region of a two-component phase diagram of $Cu-Cu_2O$ and not less than a temperature corresponding to a eutectic line obtained by connecting a line corresponding to copper and a line corresponding to a cuprous oxide composition, and directly bonding said copper member to said substrate.

2. A method according to claim 1, wherein said aluminum nitride sintered body is obtained by sintering an aluminum nitride powder containing a sintering aid.

3. A method according to claim 1, wherein said copper member contains 150 to 600 ppm of oxygen.

4. A method according to claim 1, wherein said inert gas atmosphere contains 1 to 50 ppm of oxygen.

5. A method according to claim 1, wherein copper is substantially exposed from a surface of said copper member which is bonded to said substrate.

6. A method according to claim 1, wherein a peel strength of said copper member which is bonded to said substrate is not less than 5 kgf/cm.

7. A method of manufacturing a circuit board, comprising the steps of:
   bringing a copper member containing 100 to 1,000 ppm of oxygen into contact with a substrate made of an aluminum oxide sintered body; and
   heating said substrate in an inert gas atmosphere containing 1 to 100 ppm of oxygen at a temperature not more than a temperature corresponding to a liquidus including a pure copper melting point of a hypoeutectic region of a two-component phase diagram of $Cu-Cu_2O$ and not less than a temperature corresponding to a eutectic line obtained by connecting a line corresponding to copper and a line corresponding to a cuprous oxide composition, and directly bonding said copper member to said substrate.

8. A method according to claim 7, wherein said copper member contains 100 to 600 ppm of oxygen.

9. A method according to claim 7, wherein said inert gas atmosphere contains 1 to 50 ppm of oxygen.

10. A method according to claim 7, wherein copper is substantially exposed from a surface of said copper member which is bonded to said substrate.

11. A method according to claim 7, wherein a peel strength of said copper member which is bonded to said substrate is not less than 5 kgf/cm.

* * * * *